(12) United States Patent
Yokoyama

(10) Patent No.: US 7,626,264 B2
(45) Date of Patent: Dec. 1, 2009

(54) SUBSTRATE FOR DEVICE BONDING AND METHOD FOR MANUFACTURING SAME

(75) Inventor: Hiroki Yokoyama, Shunan (JP)

(73) Assignee: Tokuyama Corporation (JP)

( * ) Notice: Subject to any disclaimer, the term of this patent is extended or adjusted under 35 U.S.C. 154(b) by 520 days.

(21) Appl. No.: 10/593,602

(22) PCT Filed: Mar. 24, 2005

(86) PCT No.: PCT/JP2005/005364

§ 371 (c)(1),
(2), (4) Date: Sep. 21, 2006

(87) PCT Pub. No.: WO2005/091351

PCT Pub. Date: Sep. 29, 2005

(65) Prior Publication Data

US 2007/0181986 A1  Aug. 9, 2007

(30) Foreign Application Priority Data

Mar. 24, 2004  (JP)  ............................ 2004-086895

(51) Int. Cl.
*H01L 23/48* (2006.01)
*H01L 23/28* (2006.01)

(52) U.S. Cl. ...................... 257/750; 257/734; 257/736; 257/737; 257/751; 257/762; 257/763; 257/764; 257/766; 257/769; 257/772; 257/779; 257/780; 257/781; 257/E23.16; 257/E23.162; 438/614; 438/627; 438/652; 438/653; 438/686; 438/687

(58) Field of Classification Search ................. 257/750, 257/751, 772, 773, 693, 734, 737–738, 762–766, 257/779, 781, 784, E23.16, E23.161, E21.21, 257/E21.584

See application file for complete search history.

(56) References Cited

U.S. PATENT DOCUMENTS 4,817,854 A * 4/1989 Tihanyi et al. ........... 228/124.1
5,021,300 A * 6/1991 Stacey ........................ 428/620
5,990,560 A  11/1999 Coult et al.

(Continued)

FOREIGN PATENT DOCUMENTS

JP  60-074539 A  4/1985

(Continued)

*Primary Examiner*—Jasmine J Clark
(74) *Attorney, Agent, or Firm*—The Webb Law Firm

(57) ABSTRACT

A substrate for device bonding is provided, which enables bonding of a device with high bond strength to an Au electrode formed on a substrate such as aluminum nitride by soldering the device at a low temperature using a soft solder metal having a low melting point such as an Au—Sn-based solder having an Au content of 10% by weight. The substrate for device bonding comprises a substrate having an Au electrode layer formed on its surface and in which (i) a layer composed of a platinum group element, (ii) a layer composed of at least one transition metal element selected from the group consisting of Ti, V, Cr and Co, (iii) a barrier metal layer composed of at least one metal selected from the group consisting of Ag, Cu and Ni and (iv) a solder layer composed of a solder containing Sn or In as a main component are laminated in this order on the Au electrode layer.

10 Claims, 1 Drawing Sheet

U.S. PATENT DOCUMENTS 7,015,583 B2  3/2006  Ishii et al.
7,196,356 B2  3/2007  Ishii et al.

FOREIGN PATENT DOCUMENTS

| | | |
|---|---|---|
| JP | 61-119051 A | 6/1986 |
| JP | 5-186884 A | 7/1993 |
| JP | 11-192581 A | 7/1999 |
| JP | 2002-124524 A | 4/2002 |
| JP | 2002-368020 A | 12/2002 |
| JP | 2002-373960 A | 12/2002 |
| JP | 2003-200289 A | 7/2003 |
| JP | 2004-072048 A | 3/2004 |

* cited by examiner

US 7,626,264 B2

SUBSTRATE FOR DEVICE BONDING AND METHOD FOR MANUFACTURING SAME

TECHNICAL FIELD

The present invention relates to a substrate for bonding and fixing a device and a process for producing the substrate.

BACKGROUND ART

With the spread of cellular phones and optical communication, ceramic substrates have been employed as substrates for mounting semiconductor devices of high output and high power consumption which work at the high-frequency band, such as GaAs-based FET, Si—Ge-based HBT, Si-based MOSFET and GaN-based laser diode, because of low dielectric loss at high frequency. Of the ceramic substrates, a sintered aluminum nitride substrate has been particularly paid attention because it has a high thermal conductivity and has a thermal expansion coefficient close to that of a semiconductor device.

In order to bond a device onto the ceramic substrate such as a sintered aluminum nitride substrate, a process comprising forming a first undercoating metal layer that is firmly bonded to the ceramic substrate and a second undercoating metal layer by metallization, then forming an electrode layer composed of a noble metal such as Au, Ag, Pd or Pt on the undercoating metal layer and then soldering a device to the noble metal electrode layer is generally carried out. For the electrode layer, Au is preferably employed because it has extremely low resistance to conduction and has excellent wire bonding property. In order to solder the device, reflowing is frequently adopted from the viewpoint of efficiency, and on that account, a solder layer pattern for bonding the device needs to be formed in advance on the electrode layer of the substrate. In such a substrate for reflowing, highly precise formation of a solder layer in a fine region on the substrate using thin film technique has become necessary with promotion of high integration of semiconductor devices, and the solder layer is generally formed by laminating various metal thin film layers so as to give a prescribed solder composition when they are melted. In this specification, such a solder is referred to as a "thin film laminated structure solder" hereinafter, and a ceramic substrate having an electrode layer and a pattern of the thin film laminated structure solder formed on the electrode layer is also referred to as a "ceramic substrate with a solder layer" simply hereinafter.

As the ceramic substrate with a solder layer, a substrate using, for a solder layer, a thin film laminated structure solder of Au—Sn-based (see patent documents 1 and 2), or a substrate using, for a solder layer, a thin film laminated structure solder which gives a Sn-37 wt % Pb eutectic solder having a melting point of 183° C. or gives a solder consisting of this eutectic solder and a slight amount of a different metal or the like (both solders are generically referred to as an "Sn—Pb eutectic solder" hereinafter) (see patent document 3), is known. The Sn—Pb eutectic solder is a most general solder as an electronic industrial solder and is widely employed, and even the thin film laminated structure solder (e.g., solder consisting of Pb thin films and Sn thin films which are alternately laminated) can bond a device with high bond strength.

On the other hand, harmfulness of lead has become a problem, and a solder containing no lead component, namely, a so-called Pb-free solder, has been employed. As the Pb-free solder, a solder having a melting point equivalent to that of the Sn—Pb eutectic solder is desired from the viewpoint of substitution for the Sn—Pb eutectic solder, and as such a Pb-free solder, a tin-rich Au—Sn solder described in the aforesaid patent document 1 is known.

Patent document 1: Japanese Patent Laid-Open Publication No. 373960/2002
Patent document 2: Japanese Patent Laid-Open Publication No. 192581/1999
Patent document 3: Japanese Patent Laid-Open Publication No. 186884/1993

However, it has become apparent that in the case where a device is soldered to the ceramic substrate with a solder layer described in the patent document 1, specifically a ceramic substrate having an Au electrode layer, a layer of at least one metal selected from the group consisting of Ag, Cu and Ni (referred to as a "barrier metal layer" hereinafter) which is arranged on the Au electrode layer, and a solder layer containing Sn or In as a main component, particularly a solder layer composed of metals containing Sn or In as a main component and having an Au content of less than 20% by weight, which is arranged on the barrier metal layer, there resides a problem that the bond strength is lowered a little after a reliability test (specifically, heat cycle test wherein the resulting device-bonded substrate is exposed to a temperature of −55° C. and a temperature of 125° C. repeatedly) though the initial bond strength is excellent.

It is an object of the present invention to provide a ceramic substrate with a solder layer, which has a Pb-free thin film laminated structure solder and has highly reliable bond strength.

SUMMARY OF THE INVENTION

The present inventor has presumed that lowering of bond strength in the ceramic substrate with a solder layer disclosed in the patent document 1 after the reliability test is caused by lowering of adhesion strength between the Au electrode layer and the barrier metal layer after the reliability test, and in order to enhance the adhesion between these layers, the present inventor has made an attempt to arrange a layer of Ti that is known as an adhesive metal. In this case, however, the Ti layer is cleaved when the ceramic substrate with a solder layer and a semiconductor device are bonded, and at the cleaved portion, the Au electrode layer and the barrier metal layer come into direct contact with each other, so that an expected effect cannot be obtained.

Then, the present inventor has further studied in order to solve the above problem, and as a result, and has found that in the case where a platinum group element is arranged on the Au electrode layer, then on the platinum group element a layer of a transition metal such as Ti that is an adhesive metal is arranged and on the transition metal layer a barrier metal layer and a Pb-free solder layer are further arranged, soldering of a device can be carried out at a low temperature, and moreover, high bond strength is obtained, cleavage of the adhesive layer does not occur, and lowering of bond strength after the reliability test does not occur. Based on this finding, the present inventor has further studied, and as a result, and has found that such effects are not limited to a case of using the tin-rich Au—Sn-based solder and are exerted also in a case of using an In-based solder, and especially in a case of using a Sn- or In-based solder having an Au content of less than 20% by weight, remarkable effects are obtained. Based on the finding, the present invention has been accomplished.

That is to say, a first invention is a substrate for device bonding, comprising a substrate having an Au electrode layer formed on its surface, wherein (i) a layer composed of a platinum group element, (ii) a layer composed of at least one transition metal element selected from the group consisting of Ti, V, Cr and Co, (iii) a barrier metal layer composed of at least one metal selected from the group consisting of Ag, Cu and Ni and (iv) a solder layer composed of a solder containing Sn or In as a main component are laminated in this order on the Au electrode layer. The solder layer (iv) is preferably composed of a solder containing Sn or In as a main component and having an Au content of less than 20% by weight.

Of such substrates for device bonding of the invention, one using, as the substrate having an Au electrode layer formed on its surface, a metallized substrate in which a first undercoating metal layer containing Ti as a main component, a second undercoating metal layer containing Pt as a main component and an electrode layer composed of Au are laminated in this order on a ceramic substrate containing aluminum nitride as a main component has features that when a device is bonded and used, dielectric loss at high frequency is low and a functional capability of dissipating heat that is generated when the bonded device is used is high.

A second invention is a process for producing a substrate for device bonding, comprising forming (i) a layer composed of a platinum group element, (ii) a layer composed of at least one transition metal element selected from the group consisting of Ti, V, Cr and Co, (iii) a barrier metal layer composed of at least one metal selected from the group consisting of Ag, Cu and Ni and (iv) a solder layer composed of a solder containing Sn or In as a main component sequentially (in this order) on an Au electrode layer which is formed on a surface of a substrate. In this process, the solder layer (iv) is preferably composed of a solder containing Sn or In as a main component and having an Au content of less than 20% by weight.

A third invention is a process for producing a device-bonded substrate, comprising placing a device with an electrode on the solder layer of the above-mentioned substrate for device bonding of the invention in such a manner that the electrode is brought into contact with the solder layer and then reflow soldering the device. A fourth invention is a device-bonded substrate produced by this process. According to the process of the third invention, a device can be efficiently soldered at a low temperature, such as a temperature of lower than 280° C., with high precision, and the device-bonded substrate of the fourth invention produced by this process can be stably used for a long period of time.

By the use of the substrate for device bonding of the invention, it becomes feasible to solder a semiconductor device onto an Au electrode formed on a surface of a substrate at a low temperature with high bond strength using a soft solder having a low melting point such as a tin-rich Au—Sn-based solder. In the device-bonded substrate of the invention in which a device has been thus bonded, the bonded portion is hardly broken even if a difference in temperature becomes large when the device is used, and the device-bonded substrate can be stably used for a long period of time. Particularly, a device-bonded substrate using, as a substrate, a ceramic substrate containing aluminum nitride as a main component and having an Au electrode formed on its surface is an extremely excellent device-bonded substrate having, in addition to the above features, both features of low dielectric loss at high frequency and excellent property of dissipating heat that is generated when the device is used.

DETAILED DESCRIPTION OF THE INVENTION

Figure 1:
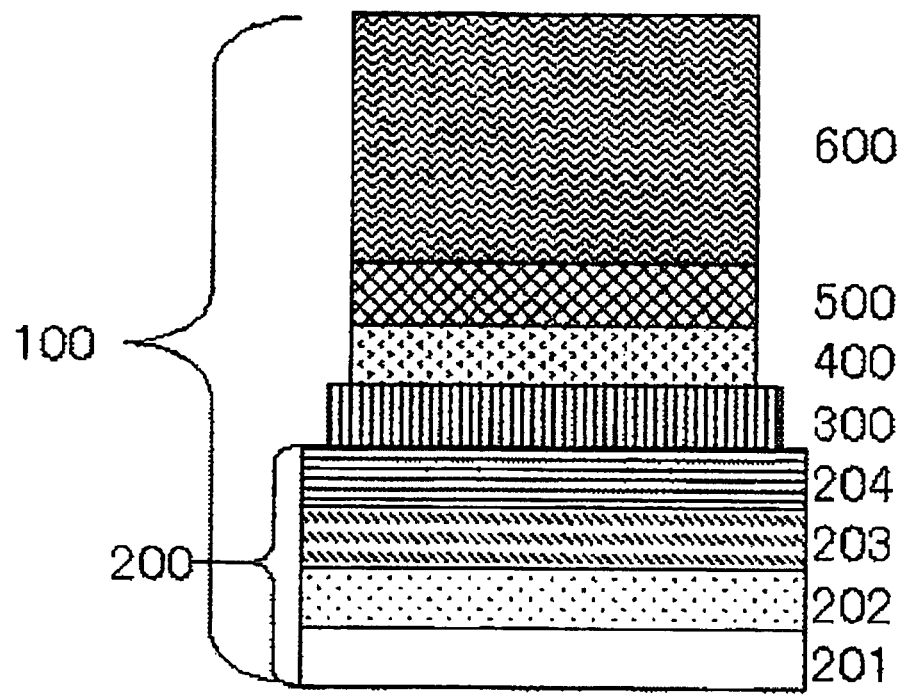
FIG. 1 is a schematic sectional view of a typical substrate for device bonding of the present invention.

The substrate for device bonding of the invention comprises a substrate having an Au electrode layer formed on its surface and in which (i) a layer composed of a platinum group element (also referred to as a "platinum group metal layer" hereinafter), (ii) a layer composed of at least one transition metal element selected from the group consisting of Ti, V, Cr and Co (also referred to as a "specific transition metal layer" hereinafter), (iii) a barrier metal layer composed of at least one metal selected from the group consisting of Ag, Cu and Ni (also referred to as a "barrier layer" simply hereinafter) and (iv) a solder layer composed of a solder containing Sn or In as a main component are laminated in this order on the Au electrode layer. The term "device" used herein means an electrical part having a terminal which can be directly connected to another electrical wiring, such as resistance or capacitor, or a semiconductor device.

The "substrate having an Au electrode layer formed on its surface" for use in the substrate for device bonding of the invention is not specifically restricted provided that it is a substrate on a part or all of a surface of which a layer composed of Au functioning as an electrode is formed. However, it is preferable to use a metallized substrate wherein an Au electrode is formed by metallization on a ceramic substrate, such as aluminum nitride, alumina, SiC or $Si_3N_4$, or a Si substrate, from the viewpoint that the dielectric loss at high frequency given when a bonded semiconductor device is used is low. In such a metallized substrate, the Au electrode layer is generally formed directly or indirectly on an undercoating metal layer that is firmly bonded to the ceramic substrate. In case of for example an alumina substrate, a metallized substrate obtained by a process comprising printing an electrode pattern composed of a high-melting point metal paste such as tungsten or molybdenum on an alumina green sheet, sintering the pattern and the green sheet simultaneously, then if necessary forming a nickel layer on the high-melting point metal layer and further forming an Au electrode thereon can be preferably used. In case of a ceramic substrate containing aluminum nitride as a main component, a metallized substrate obtained by a process comprising adding a sintering assistant to an aluminum nitride powder, molding the mixture, then forming a first undercoating metal layer containing Ti as a main component and having basically the same shape as the electrode pattern on a surface of the sintered substrate by sputtering or the like, then forming a second undercoating metal layer containing Pt as a main component on the first undercoating metal layer by sputtering or the like similarly to the above and further forming an Au electrode layer thereon by sputtering or the like can be preferably used. In the substrate for device bonding of the invention, an aluminum nitride-based metallized substrate obtained as above is particularly preferably used from the viewpoint that it has excellent property of dissipating heat that is generated when the bonded device is used.

The substrate for device bonding of the invention has a laminated structure in which (i) a platinum group metal layer, (ii) a specific transition metal layer and (iii) a barrier metal layer are laminated in this order on the Au electrode layer. By forming such a layer structure, it becomes feasible to carry out soldering at a low temperature with high bond strength, in the case where a layer of a soft solder having a low melting point, such as a tin-rich Au—Sn-based solder, is formed on the laminated structure and soldering is performed. Moreover, highly reliable bond property capable of withstanding a heat cycle is obtained. As described later, even if a beautiful film is formed as a metal layer in the film forming process, the shape of the metal layer that becomes a base is sometimes changed when another metal layer is formed thereon. The "lamination" or the "laminated structure" used in the invention does not indicate such an ideal one as shown in FIG. 1 only but is a concept also including a structure having partial distortion caused by the change of the shape in the film forming process (it is sufficient that lamination or a laminated structure has only to be present in at least a part of the metal layers).

The platinum group metal layer (i) is a layer composed of at least one element selected from the group consisting of ruthenium, rhodium, palladium, osmium, iridium and platinum, preferably platinum and/or palladium, most preferably platinum. By providing this layer, even if a cleavage occurs in the specific transition metal layer (ii) in the soldering, the barrier metal and Au of the electrode are not directly bonded to each other, and the effect of the specific transition metal layer (ii) as an adhesive metal layer is sufficiently exerted. The thickness of the platinum group metal layer (i) is preferably in the range of 0.1 to 5 µm, particularly 0.2 to 3 µm. If the thickness of the platinum group metal layer is less than 0.1 µm, the effect is low. Even if the thickness thereof is 5 µm or more, the effect is almost equal to that in the case of a thickness of 0.2 to 3 µm. It is preferable to coat the whole surface of the Au electrode with the platinum group metal layer, but unless various metal layers formed thereon are brought into direct contact with the Au electrode layer, the whole surface of the Au electrode layer does not necessarily have to be coated. Depending upon the film forming conditions for forming another metal layer on the platinum group metal layer, the shape of the platinum group metal layer is sometimes changed (e.g., film uniformity is sometimes changed, or a part of this metal layer is sometimes alloyed) after the upper layer (another metal layer) is formed on this layer, but the effect of the platinum group metal layer is not influenced unless there is such a serious defect as is capable of being visually confirmed in the formation of this layer.

The specific transition metal layer (ii) is not specifically restricted provided that the layer is composed of at least one transition metal element selected from the group consisting of Ti, V, Cr and Co. From the viewpoint of reliability of the bond strength, a layer composed of Ti and/or Cr, particularly Ti, is preferable. By providing this layer, bond property in the soldering of a device can be enhanced, and reliability of bonding is increased. The thickness of the specific transition metal layer is preferably in the range of 0.01 to 1 µm, particularly 0.03 to 0.5 µm. If the thickness of the specific transition metal layer is less than 0.01 µm, the effect is low. Even if the thickness thereof is 1 µm or more, the effect is almost equal to that in the case of a thickness of 0.03 to 0.5 µm. Depending upon the film forming conditions for forming another metal layer on the specific transition metal layer, the shape of the specific transition metal layer is sometimes changed (e.g., film uniformity is sometimes changed to open a hole and thereby bring the metal of the upper layer and the metal of the lower layer into contact with each other, or a part of this metal layer is sometimes alloyed) after the upper layer (another metal layer) is formed on this layer, but the effect of the specific transition metal layer is not influenced unless there is such a serious defect as is capable of being visually confirmed in the formation of this layer.

The barrier metal layer (iii) is not specifically restricted provided that the layer is composed of at least one metal selected from the group consisting of Ag, Cu and Ni. From the viewpoint of the effect, a layer composed of Ag is most preferable. The thickness of the barrier metal layer is preferably in the range of 0.2 to 5 µm, particularly 1 to 3 µm. If the thickness of the barrier metal layer is less than 0.2 µm, the effect is low. Even if the thickness thereof is 5 µm or more, the effect is almost equal to that in the case of a thickness of 1 to 3 µm.

The method to form the various metal layers (i) to (iii) on the Au electrode layer is not specifically restricted, and these layers can be preferably formed by, for example, sputtering, ion plating, deposition, CVD method or plating.

The substrate on which the various metal layers (i) to (iii) have been formed can be bonded to a device by feeding a solder to the substrate in the soldering stage. In the preset invention, however, in order to precisely bond a device to a given position, a solder layer (iv) is formed on the barrier metal layer, preferably only on the area where a device is to be bonded. By preparing such a substrate (substrate with a solder layer), the device mounting position can be precisely controlled, and it becomes feasible to easily carry out reflow soldering that is also easy to automate. In this case, as a solder for the solder layer to be formed on the barrier metal layer, "a solder containing Sn or In as a main component" is employed, and "a solder composed of metals containing Sn or In as a main component and having an Au content of less than 20% by weight, particularly not more than 10% by weight" is preferably employed, because the effect of the barrier metal layer is particularly high and the solder itself is relatively soft and thereby enables low-temperature soldering. Examples of such solders include the aforesaid tin-rich Au—Sn-based solder, a Sn-100% solder, an Sn—Ag solder, an Sn—Bi solder, an Sn—Sb solder, an Sn—In solder, an In-100% solder, an In—Au solder (with the proviso that the Au content is less than 20% by weight), an In—Ag solder, an In—Bi solder, an In—Sb solder, an In—Zn solder, and solders of arbitrary combinations thereof. In the soldering of a device, a solder layer reacts with an undercoating metal (e.g., Ag of the barrier layer) to form an alloy or they undergo interdiffusion. And it is difficult to determine the composition of the solder layer in the strict sense of the word. In the present invention, therefore, the metal formed as the layer (iv) is treated as a solder metal for convenience.

Of the above solders, the Au—Sn-based solder is particularly preferably used by reason that the bond strength in a die shear test after bonding of a device is highest. In the present invention, further, of such solders composed of metals containing Sn or In as a main component and having an Au content of less than 20% by weight as mentioned above, a solder composed of a metal having a melting point of lower than 280° C. and a Young's modulus of less than 50 GPa (at 25° C.) is most preferably used from the viewpoint that breakage at the bonded portion due to the temperature change that occurs when the bonded device is used hardly takes place.

The solder layer in the substrate for device bonding of the invention may be constituted of one layer composed of a single metal or an alloy of single composition. Further, the solder layer may be in the form of a laminate constituted of plural layers of different kinds of metals (or alloys) so as to give a composition satisfying the aforesaid requirements when the layers are melted and blended. The thickness of the whole solder layer is in the range of preferably 1 to 10 µm, more preferably 2 to 6 µm, particularly preferably 3 to 6 µm. If the thickness of the solder layer is less than 1 µm, there is a tendency that sufficient bond strength is not obtained because the absolute amount of the solder is small. To the contrary, if the thickness thereof exceeds 10 µm, a deficiency of screening of a side surface or an upper surface (functioning also as a light emission surface in a semiconductor device) of the device sometimes takes place after the device is bonded because the amount of the solder is too large.

The method to form the solder layer on the barrier metal layer is not specifically restricted, and the solder layer can be preferably formed by, for example, sputtering, ion plating, deposition, CVD method or plating.

The method to bond a device such as a semiconductor device to the substrate for device bonding of the invention is not specifically restricted, and publicly known soldering methods can be adopted without any restriction. However, by reason that precise bonding can be efficiently carried out, it is preferable that a device with an electrode is placed on the solder layer of the substrate for device bonding in such a manner that the electrode is brought into contact with the solder layer and then the device is reflow soldered. The "reflow soldering" is a method wherein a solder is previously fed onto a given land of a substrate or an electrode of a part or both of them, and after the part is fixed to a given position of the substrate, the solder is melted (made to flow) to bond the part and the substrate to each other. In the above method, reflowing of the solder is not specifically restricted, and for example, reflowing using a reflow conveyer, reflowing using a hot plate and vapor reflowing are adoptable. The heating temperature and the heating time may be properly determined according to the type of the solder used. In the case where the substrate for device bonding of the invention is used, properties of the solder used are not impaired. When a tin-rich Au—Sn-based solder is used, for example, it is possible to carry out excellent soldering at a low temperature such as a temperature of lower than 280° C.

The device to be soldered is not specifically restricted provided that it has an electrode composed of a metal capable of being bonded with a solder. In general semiconductor devices, many of the electrodes are composed of Au. When a device with such an Au electrode is soldered, Au atoms of the Au electrode will be diffused into the solder. But, the diffusion occurring in the soldering will exert no serious influence on the bond strength because high bond strength is obtained also when a device with an Au electrode is soldered, as described later in the working examples. However, it is preferable to use a device with an electrode whose surface that is to be brought into contact with a solder is coated with at least one metal selected from Ag, Cu and Ni, particularly Ag, because the above diffusion can be inhibited.

EXAMPLES

The present invention is further described with reference to the following examples and comparative examples, but it should be construed that the invention is in no way limited to those examples.

Example 1

A substrate for device bonding, which had such a structure as shown in FIG. 1, was prepared in the following manner. FIG. 1 is a conceptual view showing a section of a typical substrate for device bonding 100 of the invention, and the substrate has a structure wherein a first undercoating metal layer 202 containing Ti as a main component, a second undercoating metal layer 203 containing Pt as a main component and an Au electrode layer 204 are laminated in this order on a sintered aluminum nitride substrate 201 to form a substrate 200, and on the Au electrode layer of the substrate 200, (i) a platinum group metal layer 300 and (ii) a specific transition metal layer 400 are laminated in this order, and thereon, (iii) a barrier metal layer 500 and (iv) a solder layer 600 composed of a Sn-based or In-based solder having an Au content of less than 20% by weight are further laminated.

First, on a surface of a sintered aluminum nitride substrate (50.8 mm×50.8 mm×10.3 mm (t), available from Tokuyama Corporation), the first undercoating metal layer of 0.06 μm thickness containing Ti as a main component, the second undercoating metal layer of 0.2 μm thickness containing Pt as a main component and the Au electrode layer of 0.6 μm thickness were formed in this order by sputtering using a sputtering apparatus, and then patterning was carried out. Subsequently, on the Au electrode layer, a platinum group metal Pt layer of 0.25 μm thickness was formed, followed by patterning. Thereafter, the barrier layer consisting of Ti of 0.06 μm thickness and Ag of 2 μm thickness was formed on the above Pt using a vacuum deposition apparatus. Then, a solder layer of 5 μm thickness composed of an Au—Sn alloy (melting point: 217° C., Young's modulus: 45.0 GPa (at 25° C.)) having an Au content of 10% by weight was formed on the barrier layer by a simultaneous deposition method using Au and Sn as targets. Thus, a substrate for device bonding of the invention was prepared. Then, on the solder layer of the thus prepared substrate for device bonding, a semiconductor device with an Au electrode was placed, and the device was bonded at 250° C. for 30 seconds using a die bonder apparatus to prepare a device-bonded substrate. In the same manner as above, 40 device-bonded substrates were prepared, and 10 of them were measured on the bond strength by a die shear tester (manufactured by IMADA). As a result, a mean bond strength was 2.8 kgf/mm². Thereafter, the residual 30 device-bonded substrates were exposed to temperatures of −55° C. and 125° C. repeatedly using a TABAI THERMAL-SHOCK-CHAMBER (TSV-40S) to perform a heat cycle test. After the number of exposure times reached 100, 500 and 1000, 10 device-bonded substrates were taken out at each time, and their bond strengths were measured. The results are set forth in Table 1.

TABLE 1

|  | Platinum group metal layer, Type | Specific transition metal layer, Type | Solder layer, Type | Solder layer thickness (mm) | Barrier metal layer, Type | Barrier metal layer Layer thickness (mm) | Mean bond strength before reliability test (n = 10) | Mean bond strength after reliability test of exposure of 100 times (n = 10) | Mean bond strength after reliability test of exposure of 500 times (n = 10) | Mean bond strength after reliability test of exposure of 1000 times (n = 10) |
|---|---|---|---|---|---|---|---|---|---|---|
| Ex. 1 | Pt | Ti | Au10-Sn | 5 | Ag | 2 | 2.8 | 3.2 | 2.6 | 3.0 |
| Ex. 2 | Pt | Ti | In 100% | 5 | Ag | 2 | 2.5 | 2.3 | 2.3 | 2.6 |

TABLE 1-continued

| | Platinum group metal layer, Type | Specific transition metal layer, Type | Solder layer, Type | Solder layer thickness (mm) | Barrier metal layer, Type | Barrier metal layer Layer thickness (mm) | Mean bond strength before reliability test (n = 10) | Mean bond strength after reliability test of exposure of 100 times (n = 10) | Mean bond strength after reliability test of exposure of 500 times (n = 10) | Mean bond strength after reliability test of exposure of 1000 times (n = 10) |
|---|---|---|---|---|---|---|---|---|---|---|
| Ex. 3 | Pt | Ti | Au12-Sn | 5 | Cu | 2 | 2.4 | 2.1 | 2.2 | 2.4 |
| | Pt | Ti | Au13-Sn | 5 | Ni | 2 | 2.3 | 2.6 | 2.7 | 2.2 |
| Ex. 4 | Pt | Ti | Au14-Sn | 2 | Ag | 2 | 2.1 | 2.2 | 2.1 | 2.4 |
| | Pt | Ti | Au15-Sn | 3 | Ag | 2 | 2.4 | 2.2 | 2.4 | 2.3 |
| | Pt | Ti | Au16-Sn | 6 | Ag | 2 | 2.7 | 2.5 | 2.6 | 2.7 |
| | Pt | Ti | Au17-Sn | 10 | Ag | 2 | 3.1 | 3.5 | 2.8 | 3.3 |
| Ex. 5 | Pt | Ti | Au18-Sn | 5 | Ag | 1 | 2.6 | 2.7 | 2.3 | 2.4 |
| | Pt | Ti | Au19-Sn | 5 | Ag | 3 | 2.5 | 2.2 | 2.6 | 2.7 |
| | Pt | Ti | Au20-Sn | 5 | Ag | 5 | 2.7 | 2.3 | 2.9 | 2.5 |
| Ex. 6 | Pd | Ti | Au21-Sn | 5 | Ag | 2 | 2.6 | 2.4 | 2.8 | 2.6 |
| | Pt | Cr | Au22-Sn | 5 | Ag | 2 | 2.8 | 2.6 | 2.6 | 2.8 |
| | Pt | V | Au23-Sn | 5 | Ag | 2 | 2.7 | 2.8 | 2.9 | 2.8 |
| | Pt | Co | Au24-Sn | 5 | Ag | 2 | 2.9 | 2.7 | 2.6 | 2.7 |
| Comp. Ex. 1 | none | none | Au24-Sn | 5 | Ag | 2 | 2.8 | 2.2 | 2.4 | 2.0 |
| | none | none | Au26-Sn | 2 | Ag | 2 | 2.1 | 1.5 | 1.1 | 0.9 |
| Comp. Ex. 2 | none | Ti | Au27-Sn | 5 | Ag | 2 | 2.7 | 2.3 | 2.0 | 2.1 |

Example 2

A substrate for device bonding was prepared in the same manner as in Example 1, except that a solder layer of 5 μm thickness was formed by deposition using In (melting point: 156° C., Young's modulus: 12.7 GPa (at 125° C.)) as a target. Then, a device-bonded substrate was prepared in the same manner as in Example 1, except that the bonding temperature was changed to 210° C. In the same manner as above, 40 device-bonded substrates were prepared, and their bond strengths were measured. As a result, a mean bond strength was 2.5 kgf/mm². The results of a heat cycle test are set forth in Table 1.

Example 3

Substrates for device bonding and device-bonded substrates were prepared in the same manner as in Example 1, except that the material of the barrier layer was changed from Ag to a metal shown in Table 1. Then, bond strengths were measured in the same manner as in Example 1. The results are set forth in Table 1.

Example 4

Substrates for device bonding and device-bonded substrates were prepared in the same manner as in Example 1, except that the thickness of the solder layer was changed to a thickness shown in Table 1. Then, bond strengths were measured in the same manner as in Example 1. The results are set forth in Table 1.

Example 5

Substrates for device bonding and device-bonded substrates were prepared in the same manner as in Example 1, except that the thickness of the barrier layer was changed to a thickness shown in Table 1. Then, bond strengths were measured in the same manner as in Example 1. The results are set forth in Table 1.

Example 6

Substrates for device bonding and device-bonded substrates were prepared in the same manner as in Example 1, except that the material of the platinum group metal layer or the specific transition metal layer was changed to a metal shown in Table 1. Then, bond strengths were measured in the same manner as in Example 1. The results are set forth in Table 1.

Comparative Example 1

Substrates for device bonding and device-bonded substrates were prepared in the same manner as in Example 1, except that the platinum group metal layer and the specific transition metal layer were not provided. Then, bond strengths were measured in the same manner as in Example 1. Also in case of device-bonded substrates which had the same constitution as above and the thickness of the solder layer of which was changed, evaluation was carried out. The results are set forth in Table 1. As shown in Table 1, in the case where the platinum group metal layer and the specific transition metal layer were not provided, a little lowering of the bond strength was observed after the reliability test.

Comparative Example 2

Figure 2:
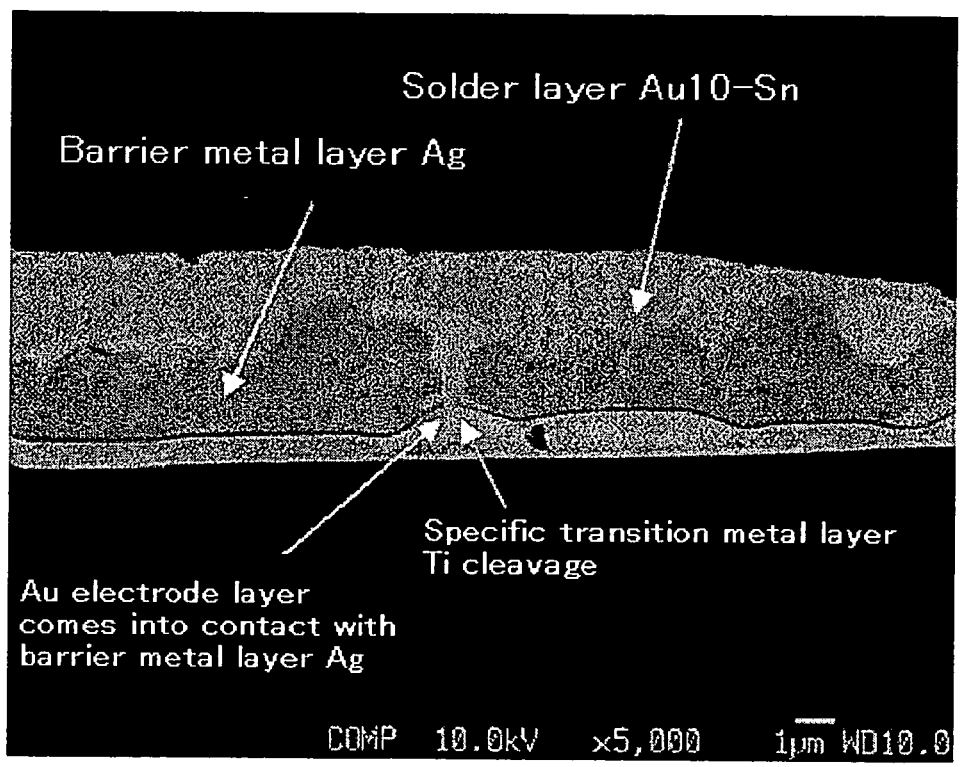
FIG. 2 is a SEM photograph (compositional image) of a substrate section after melting of a solder in Comparative Example 2 (thickness of solder layer: 5 μm).

Substrates for device bonding and device-bonded substrates were prepared in the same manner as in Example 1, except that the platinum group metal layer was not provided. Then, bond strengths were measured in the same manner as in Example 1. The results are set forth in Table 1. As shown in Table 1, also in the case where the platinum group metal layer was not provided, a little lowering of the bond strength was observed after the reliability test. The cause will be that when the solder of the substrate for device bonding was melted, the transition metal element Ti was cleaved and at this cleaved portion the Au electrode layer and the barrier metal layer came into direct contact with each other, as shown in FIG. 2, and there was little difference between this and Comparative Example 1.

The invention claimed is:

1. A substrate for device bonding, comprising a substrate having an Au electrode layer formed on its surface, wherein (i) a layer composed of a platinum group element, (ii) a layer composed of at least one transition metal element selected from the group consisting of Ti, V, Cr and Co, (iii) a barrier metal layer composed of at least one metal selected from the group consisting of Ag, Cu and Ni and (iv) a solder layer composed of a solder containing Sn or In as a main component are laminated in this order on the Au electrode layer.

2. The substrate for device bonding as claimed in claim 1, wherein the solder layer (iv) is composed of said solder containing Sn or In as a main component and having an Au content of less than 20% by weight.

3. The substrate for device bonding as claimed in claim 1, wherein the substrate having said Au electrode layer on its surface is a metallized substrate in which a first undercoating metal layer containing Ti as a main component, a second undercoating metal layer containing Pt as a main component and said electrode layer composed of Au are laminated in this order on a ceramic substrate containing aluminum nitride as a main component.

4. A process for producing a substrate for device bonding, comprising forming (i) a layer composed of a platinum group element, (ii) a layer composed of at least one transition metal element selected from the group consisting of Ti, V, Cr and Co, (iii) a barrier metal layer composed of at least one metal selected from the group consisting of Ag, Cu and Ni and (iv) a solder layer composed of a solder containing Sn or In as a main component in this order on an Au electrode layer which is formed on a surface of a substrate.

5. The process for producing a substrate for device bonding as claimed in claim 4, wherein the solder layer (iv) is composed of said solder containing Sn or In as a main component and having an Au content of less than 20% by weight.

6. A substrate for device bonding, which is produced by the process of claim 4.

7. A process for producing a device-bonded substrate, comprising placing a device with an electrode on the solder layer of the substrate for device bonding of claim 1 in such a manner that the electrode is brought into contact with the solder layer and then reflow soldering is applied to the device.

8. A device-bonded substrate, which is produced by the process of claim 7.

9. The substrate for device bonding as claimed in claim 2, wherein the substrate having said Au electrode layer on its surface is a metallized substrate in which a first undercoating metal layer containing Ti as a main component, a second undercoating metal layer containing Pt as a main component and said electrode layer composed of Au are laminated in this order on a ceramic substrate containing aluminum nitride as a main component.

10. A substrate for device bonding, which is produced by the process of claim 5.

* * * * *

UNITED STATES PATENT AND TRADEMARK OFFICE
CERTIFICATE OF CORRECTION

PATENT NO. : 7,626,264 B2  Page 1 of 1
APPLICATION NO. : 10/593602
DATED : December 1, 2009
INVENTOR(S) : Hiroki Yokoyama It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 591 days.

Signed and Sealed this

Second Day of November, 2010

David J. Kappos
*Director of the United States Patent and Trademark Office*